United States Patent [19]
Kelwaski et al.

[11] Patent Number: 6,135,780
[45] Date of Patent: Oct. 24, 2000

[54] DUAL FUNCTION LAMP SOCKET

[75] Inventors: H. Edward Kelwaski, Craigville; Robert D. Dannenberg, Auburn, both of Ind.

[73] Assignee: Navistar International Transportation Corp, Chicago, Ill.

[21] Appl. No.: 09/443,261

[22] Filed: Nov. 22, 1999

[51] Int. Cl.$^7$ ................................................. H01R 12/00
[52] U.S. Cl. ............................................. 439/57; 439/547
[58] Field of Search ........................... 439/57, 517, 547, 439/78, 296, 298, 299, 549

[56] References Cited

U.S. PATENT DOCUMENTS

| | | | |
|---|---|---|---|
| 4,373,771 | 2/1983 | Cross et al. | 439/549 |
| 5,536,174 | 7/1996 | Forish | 439/57 |
| 5,702,254 | 12/1997 | Whitson et al. | 439/57 |
| 5,800,183 | 9/1998 | Paul et al. | 439/57 |

*Primary Examiner*—T. C. Patel
*Attorney, Agent, or Firm*—Jeffrey P. Calfa; Dennis Kelly Sullivan

[57] ABSTRACT

Two lamp sockets (40, 42) on a wiring board (32) behind a switch assembly (18) have identical geometries. Each comprises a through-hole with a polarizing feature. Plural discrete contact pads (44, 46, 48, 50) are disposed on the board surface spaced apart around the margin of each through-hole. Plural discrete conductor traces (52, 54, 56, 58) are printed on the board surface to run from the respective contact pads. Each socket can accept either a first model (66) or a second model (68) of lamp assembly to make either socket a status indicator for the switch assembly or a nighttime illumination socket. A common wiring board can thereby serve different requirements for the locations of status indicator and nighttime illumination lamps.

10 Claims, 3 Drawing Sheets

DUAL FUNCTION LAMP SOCKET

FIELD OF THE INVENTION

This invention relates generally to sockets for mounting lamps, especially small lamps like light emitting diodes (LED's) for example, in limited space, such as in a switch module for an instrument panel of an automotive vehicle.

BACKGROUND AND SUMMARY OF THE INVENTION

An instrument panel of an automotive vehicle contains electric switches for operating various devices in the vehicle. For any of various reasons, such as limitations on space available for the number of switches that are desired to be used in a particular instrument panel, it may be important to use switches that are relatively compact in package size. It may also be desirable to group the switches into modules, or clusters. Furthermore, it may be desirable that a switch be illuminated during nighttime operation of a vehicle when the headlight switch is turned on, and that may be done by using a nighttime illumination lamp. It may also be appropriate to use a status indicator lamp to indicate switch status, i.e. causing an indicator lamp to illuminate when a switch is on. These objectives may be accomplished in different ways.

For indicating switch status, a status indicator lamp may be mounted on an instrument panel proximate a switch. Alternatively, a status indicator lamp may be incorporated directly into a switch. In either case, the status indicator lamp will illuminate when the switch is on but will not illuminate when the switch is off.

A switch actuator, a rocker for example, that is present on the face of an instrument panel may be constructed of translucent plastic and masked in a manner to create indicia, either literal and/or symbolic, for identifying the function that the switch performs. If a nighttime illumination lamp is disposed behind the actuator, the indicia may be made prominent during nighttime conditions by causing the illumination lamp to illuminate when the vehicle headlights and running lights are turned on by the vehicle's headlight switch. If a status indicator lamp is also disposed behind the actuator so as to be distinct from the nighttime illumination lamp, it may be made to illuminate when the switch is on.

In conjunction with reductions in switch package size, the package size of lamps that are associated with instrument panel switches has also been a subject of size reduction. It is known to use LED's for such lamps. A representative lamp is an assembly that comprises a base and an LED on that base. The base is adapted for mounting in a socket to establish connection of an electric circuit to the LED.

One aspect of the present invention relates to further improvements in packaging lamp assemblies in association with switches, such as in a switch module for an instrument panel of an automotive vehicle.

Instrument panel switch modules that have identical switch groupings, or clusters, but are designed for use in different vehicle models, may utilize switches that are in particular locations in the switch cluster in different ways depending on the particular vehicle model. Accordingly, it may be preferable to design a switch module so as to allow certain functions associated with switches and/or lamps in the module to be established by software programming, rather than by specific hardware in the panel. In that way a common module may be mass-produced so as to be potentially useful in any of the various vehicle models, and once the particular vehicle model in which it is to be installed has been established, it is rendered unique to that model by software programming.

Another aspect of the present invention relates to improvements in instrument panel switch modules that allow a common module having a wiring board that is common to all the module's switches to be used in any of various vehicle models to accommodate different lamp functions associated with various switches of the module in different vehicle models.

A particular aspect of the invention relates to a dual function lamp socket comprising: a substantially rigid wiring board containing a through-hole that has a perimeter margin bounding an opening; plural discrete contact pads disposed on the board surface spaced apart around the margin of the through-hole; plural discrete conductor traces that run on the board surface from the plural discrete contact pads; the perimeter margin of the through-hole having a polarizing feature that allows a base of a first lamp assembly model that has a matching polarizing feature to be inserted into the through-hole only when the respective polarizing features are in unique circumferential registry and after having been so inserted, the first lamp assembly model to be circumferentially indexed a fixed distance to an installed position where a pair of contacts on the base of the first lamp assembly model are in contact with a first pair of the contact pads to place a lamp of the first lamp assembly model in circuit across the first pair of contact pads; the plural discrete contact pads comprising a second pair that is distinct from the first pair and disposed not to place the lamp of the first lamp assembly model in circuit across the second pair of contact pads when the base of the first lamp assembly model is in the installed position, but instead to place the lamp of a second lamp assembly model in circuit across the second pair of contact pads when a base of the second lamp assembly model that has the same polarizing feature as that of the first lamp assembly model has been inserted into the through-hole and the second lamp assembly model indexed the fixed distance to the installed position and not to place the lamp of the second lamp assembly model in circuit across the first pair of contact pads when the second lamp assembly model is in the installed position.

Another particular aspect of the invention relates to a circuit board assembly for use with an electrical panel of an automotive vehicle comprising: a substantially rigid wiring board containing a plurality of through-holes each of which has a perimeter margin bounding an opening; plural discrete contact pads disposed on the board surface spaced apart around the margin of each through-hole; plural discrete conductor traces that run on the board surface from the plural discrete contact pads; the perimeter margin of each through-hole having a polarizing feature that allows a base of a first lamp assembly model that has a matching polarizing feature to be inserted into the through-hole only when the respective polarizing features are in unique circumferential registry and after having been so inserted, the first lamp assembly model to be circumferentially indexed a fixed distance to an installed position where a pair of contacts on the base of the first lamp assembly model are in contact with a first pair of the contact pads to place a lamp of the first lamp assembly model in circuit across the first pair of contact pads; the plural discrete contact pads around the margin of each through-hole comprising a second pair that is distinct from the first pair and disposed not to place the lamp of the first lamp assembly model in circuit across the second pair of contact pads when the base of the first lamp assembly model is in the installed position, but instead to place the lamp of a second lamp assembly model in circuit across the second pair of contact pads when a base of the second lamp assembly model that has the same polarizing feature as that of the first lamp assembly model has been inserted into the through-hole and the second lamp assembly model indexed the fixed distance to the installed position and not to place the lamp of the second lamp assembly model in circuit across the first pair of contact pads when the second lamp assembly model is in the installed position; a first lamp assembly model disposed in installed position in a first of the through-holes; and a second lamp assembly model disposed in installed position in a second of the through-holes.

Still another particular aspect of the invention relates to an electric module comprising: a housing; a back-lighted member on a face of the housing; a substantially rigid wiring board disposed behind the face of the housing and containing a through-hole that registers with the back-lighted member and that has a perimeter margin bounding an opening; plural discrete contact pads disposed on the board surface spaced apart around the margin of the through-hole; plural discrete conductor traces that run on the board surface from the plural discrete contact pads; the perimeter margin of the through-hole having a polarizing feature that allows a base of a first lamp assembly model that has a matching polarizing feature to be inserted into the through-hole only when the respective polarizing features are in unique circumferential registry and after having been so inserted, the first lamp assembly model to be circumferentially indexed a fixed distance to an installed position where a pair of contacts on the base of the first lamp assembly model are in contact with a first pair of the contact pads to place a lamp of the first lamp assembly model in circuit across the first pair of contact pads; the plural discrete contact pads comprising a second pair that is distinct from the first pair and disposed not to place the lamp of the first lamp assembly model in circuit across the second pair of contact pads when the base of the first lamp assembly model is in the installed position, but instead to place the lamp of a second lamp assembly model in circuit across the second pair of contact pads when a base of the second lamp assembly model that has the same polarizing feature as that of the first lamp assembly model has been inserted into the through-hole and the second lamp assembly model indexed the fixed distance to the installed position and not to place the lamp of the second lamp assembly model in circuit across the first pair of contact pads when the second lamp assembly model is in the installed position.

Still another particular aspect of the invention relates to an automotive vehicle comprising: an interior electrical panel that contains switches and indicator lamps for a driver of the vehicle and that has a front face containing plural back-lighted members for presenting information to the driver, including information regarding status of the switches; a wiring board assembly disposed behind the front face comprising a substantially rigid wiring board containing a plurality of through-holes each of which has a perimeter margin bounding an opening and each of which registers with a respective back-lighted member; plural discrete contact pads disposed on the board surface spaced apart around the margin of each through-hole; plural discrete conductor traces that run on the board surface from the plural discrete contact pads; the perimeter margin of each through-hole having a polarizing feature that allows a base of a first lamp assembly model that has a matching polarizing feature to be inserted into the through-hole only when the respective polarizing features are in unique circumferential registry and after having been so inserted, the first lamp assembly model to be circumferentially indexed a fixed distance to an installed position where a pair of contacts on the base of the first lamp assembly model are in contact with a first pair of the contact pads to place a lamp of the first lamp assembly model in circuit across the first pair of contact pads; the plural discrete contact pads around the margin of each through-hole comprising a second pair that is distinct from the first pair and disposed not to place the lamp of the first lamp assembly model in circuit across the second pair of contact pads when the base of the first lamp assembly model is in the installed position, but instead to place the lamp of a second lamp assembly model in circuit across the second pair of contact pads when a base of the second lamp assembly model that has the same polarizing feature as that of the first lamp assembly model has been inserted into the through-hole and the second lamp assembly model indexed the fixed distance to the installed position and not to place the lamp of the second lamp assembly model in circuit across the first pair of contact pads when the second lamp assembly model is in the installed position; first lamp assembly models disposed in installed position in through-holes that register with back-lighted members that provide switch status information; and second lamp assembly models disposed in installed position in through-holes that register with back-lighted members other than back-lighted members that provide information other than switch status information.

The foregoing, along with further aspects, features, and advantages of the invention, will be seen in the following disclosure of a presently preferred embodiment of the invention depicting the best mode contemplated at this time for carrying out the invention. The disclosure includes drawings, briefly described as follows.

DESCRIPTION OF THE PREFERRED EMBODIMENT

Figure 1:
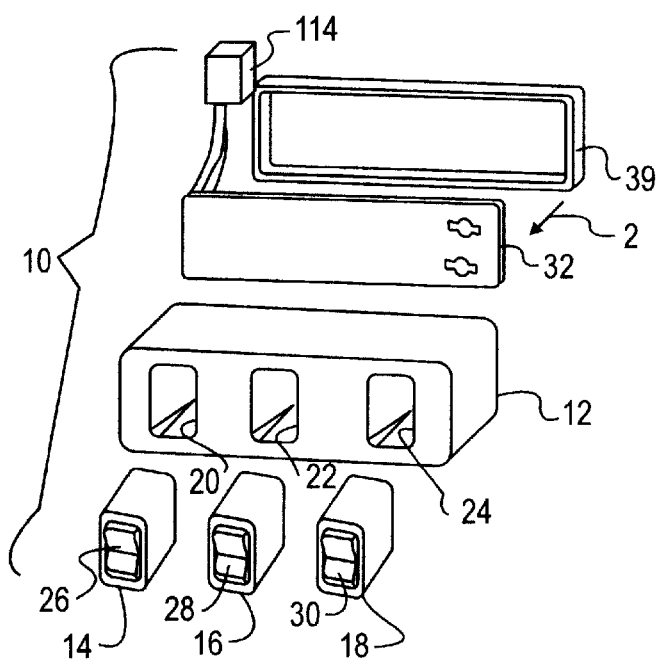
FIG. 1 is an exploded perspective view of an instrument panel module that embodies principles of the present invention.

FIG. 1 shows an example of an instrument panel module 10 of an automotive vehicle that comprises a generally rectangular housing 12 that holds three switch assemblies 14, 16, 18 side-by-side within its interior. A front face of housing 12 contains three side-by-side apertures 20, 22, 24 with which respective actuators 26, 28, 30 of the respective switch assemblies register so as to make the actuators accessible at the front of module 10 to a driver of the vehicle. By way of example, each switch assembly is portrayed as a rocker type device that has a rocker for its actuator.

Also disposed within the interior of housing 12 behind the switch assemblies is a printed wiring board 32 which may be considered to have three side-by-side zones, each of which registers with the rear of a respective switch assembly. Certain connections are present between each switch assembly and wiring board 32. Those connections more fully appear in other Figures, such as FIGS. 2 and 3, where they are designated by general reference numerals 34, 36, 38 respectively for the respective switch assemblies 14, 16, 18. Wiring board 32 is fabricated as a substantially rigid part by using known methods and known materials. A cover 39 closes the back of housing 12.

For illustrating principles of the present invention, two lamp sockets 40, 42 are shown associated with the zone of wiring board 32 behind switch assembly 18. Both sockets 40, 42 have identical geometries. Each comprises a through-hole in wiring board 32 that has a perimeter margin bounding an opening. Plural discrete contact pads are disposed on the board surface spaced apart around the margin of each through-hole. There are four such contact pads 44, 46, 48, 50 around each margin, and the four pads are arranged in the same geometric pattern around each margin. Plural discrete conductor traces 52, 54, 56, 58 are printed on the board surface to form printed wires running from the respective contact pads 44, 46, 48, 50.

Figure 4:
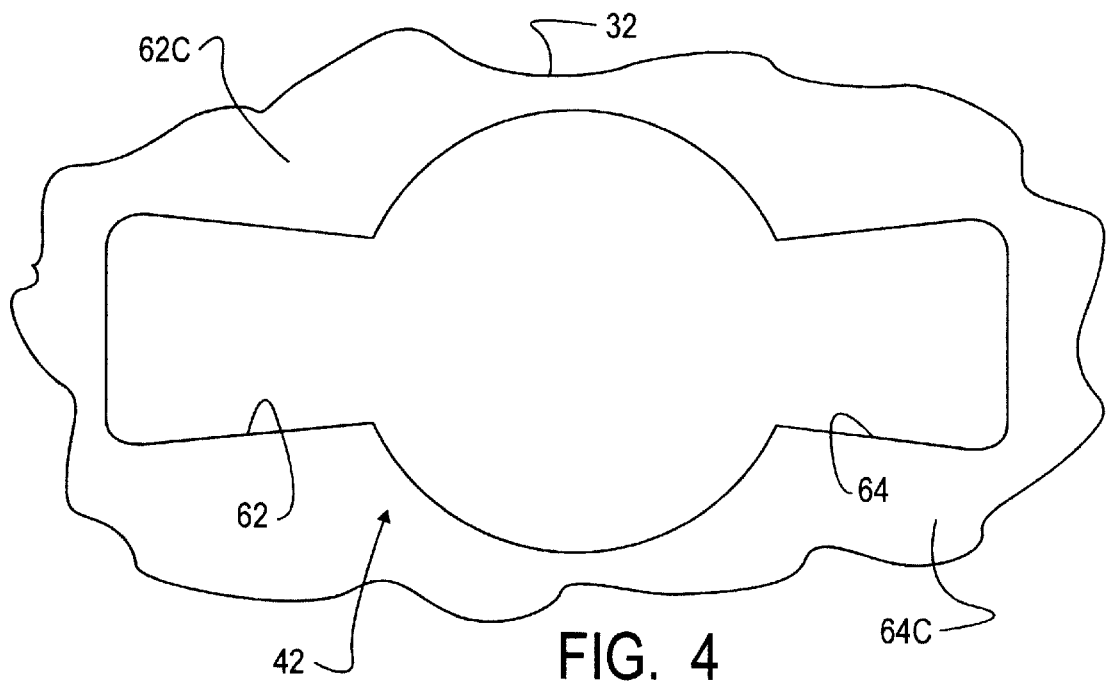
FIG. 4 is an enlarged plan view in the direction of arrow 4 in FIG. 3.

The perimeter margin of each socket through-hole has a polarizing feature. The illustrated feature comprises diametrically opposed cut-outs 62, 64 that extend radially from an otherwise circular edge of the through-hole over short angular spans about the center of the through-hole. It is important to notice that although the cut-outs have similar shapes, they are not congruent. FIG. 4 shows that cut-out 62 has a longer radial extent than cut-out 64.

Figure 5:
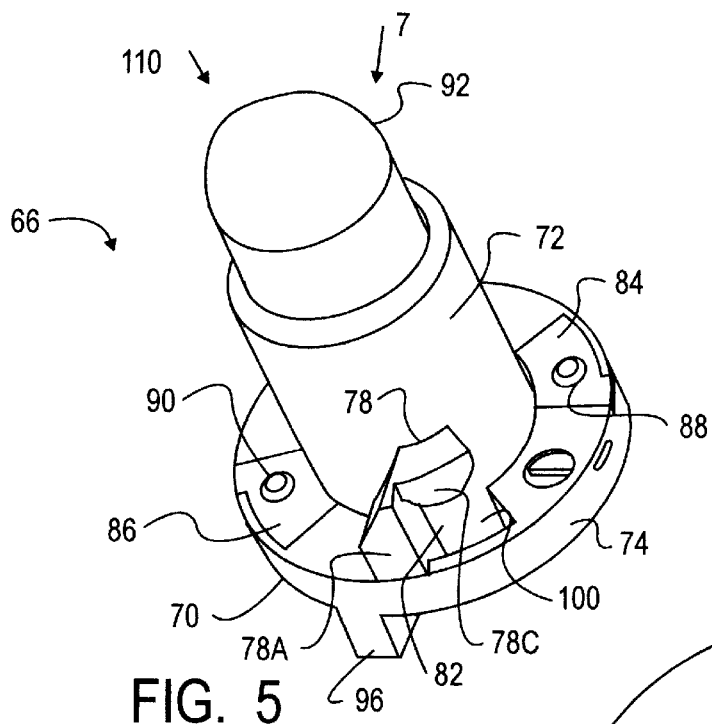
FIG. 5 is a perspective view of a first lamp assembly model.
Figure 7:
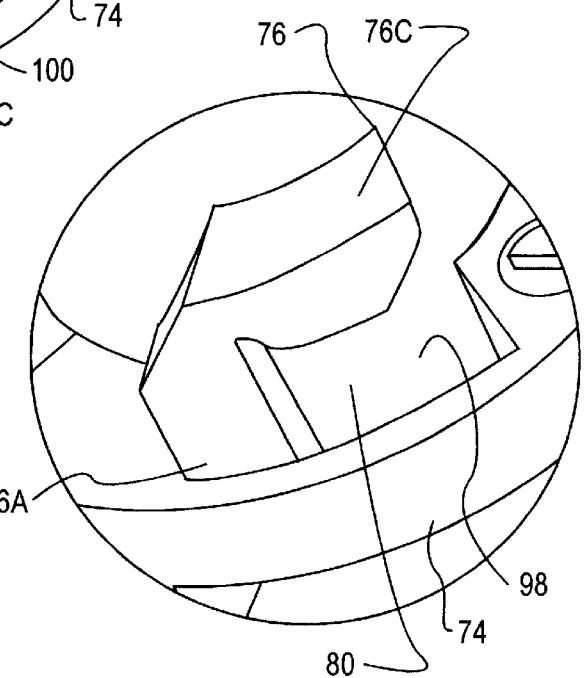
FIG. 7 is a view in the direction of arrow 7 in FIG. 5.
Figure 6:
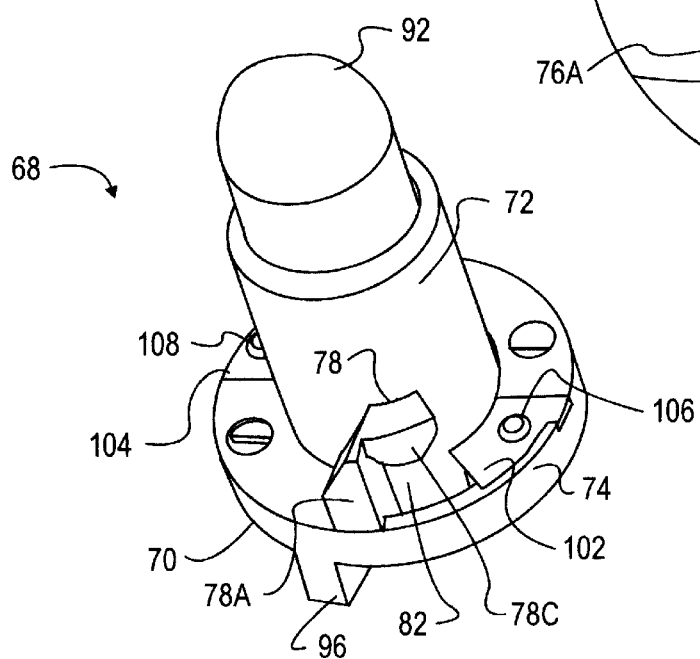
FIG. 6 is a perspective view of a second lamp assembly model.

Lamps assemblies, such as a first lamp assembly model 66 shown by itself in FIGS. 5 and 7, and a second lamp assembly model 68 shown by itself in FIG. 6, are adapted to be installed in the sockets. As will be explained, the two lamp assembly models are generally identical except for locations of their contacts.

Lamp assembly 66 comprises a base 70 having a cylindrical side wall 72 and a generally circular flange 74 around the outside of side wall 72 near one end of the side wall. Base 70 further comprises two locking tabs 76 and 78 that are generally diametrically opposite each other. Each locking tab has an axial portion 76A, 78A and a circumferential portion 76C, 78C. Each axial portion 76A, 78A extends in an axial direction from where it adjoins flange 74 toward the opposite end of side wall 72. Along that extent, each axial portion adjoins side wall 72. Each circumferential portion 76C, 78C also adjoins side wall 72 and extends in the same circumferential sense from the respective axial portion 76A, 78A such that the two locking tabs form respective throats 80, 82 that open in the same circumferential sense. Each circumferential portion 76C, 78C is spaced axially from flange 74 a distance approximately equal to the thickness of wiring board 32 to endow each throat 80, 82 with a dimension (as measured axially of the lamp assembly model) equal to that thickness. The two locking tabs are thus generally identical in appearance, but importantly, their axial portions 76A, 78A have different thicknesses as measured radial to side wall 72. In particular, the axial portion 78A of locking tab 78 is thicker than axial portion 76A of locking tab 76 such that axial portion 78A comes to the perimeter edge of flange 74 as can be seen in FIG. 5, while axial portion 76A of locking tab 76 stops short of the perimeter edge of flange 74 as can be seen in FIG. 7.

Lamp assembly 66 further comprises two contacts 84, 86 that are disposed on one axial face of flange 74 generally diametrically opposite each other. Each contact 84, 86 is formed to have a respective dome 88, 90 that is raised in a direction away from flange 74. Contacts 84, 86 are connected to an illumination element 92 that protrudes from the end of side wall 72 to face in the same axial direction as the direction in which the two domes 88, 90 are raised. Disposed on the opposite face of flange 74 from contacts 84, 86 generally diametrically opposite each other are two twist tabs 94, 96 that are used to twist lamp assembly 66 into and out of interlocking engagement with a socket.

Base 70 may be fabricated as a molded plastic part with the two locking tabs 76, 78 and the two twist tabs 94, 96 integrally formed therein. Mold pins that are used in the molding of circumferential portions 76C, 78C leave residual holes 98, 100 in flange 74. Contacts 84, 86 are fabricated from electrically conductive metal and assembled to flange 74. An example of a suitable illumination element 92 is an LED, and its leads may be joined respectively to respective contacts 84, 86.

Lamp assembly 68 has a construction like that of lamp assembly model 66, except for its contacts 102, 104. A comparison of FIGS. 5 and 6 shows firstly that the portions of contacts 102, 104 on flange 74 are essentially symmetrically opposite corresponding portions of contacts 84, 86 on flange 74 of lamp assembly model 66, and secondly that contacts 102, 104 are in different circumferential locations relative to locking tabs 76, 78 of lamp assembly model 68 from the locations of contacts 84, 86 relative to locking tabs 76, 78 of lamp assembly model 66. Contacts 102, 104 are spaced circumferentially from each other the same angular distance as contacts 84, 86 are spaced from each other. Each contact 102, 104 has a respective raised dome 106, 108.

As viewed axially in the direction of arrow 110 in FIG. 5, base 70 is constructed such that the outline of side wall 72 and locking tabs 76, 78 matches, with appropriate slight dimensional clearance, that of each socket through-hole, including cut-outs 62, 64, in wiring board 32. By disposing lamp assembly model 66 relative to socket 40 in the manner suggested by FIG. 2 with side wall 72 aligned with the through-hole center and circumferentially oriented to the through-hole such that locking tab 78 is in circumferential registration with cut-out 62 and locking tab 76 with cut-out 64, and then advancing the lamp assembly toward the wiring board, the lamp assembly can be passed through the through-hole until flange 74 abuts the wiring board around the margin of the through-hole. When that happens, the circumferential portions 76C, 78C have passed through the through-hole to the front face of wiring board 32, and contacts 84, 86 respectively are abutting contacts 46, 44 respectively. By now twisting base 70 in the clockwise sense as viewed in FIG. 2 relative to the wiring board, locking tabs 76, 78 will lock onto portions of the margins of the sockets such that the clockwise radial margin 62C, 64C of each cut-out 62, 64 becomes lodged in the respective throat 82, 80 until no further twisting can occur due to abutment of axial portions 78A, 76A with the edges of the clockwise radial margins. As the socket is being twisted, the domes of the respective contacts 84, 86 ride off of respective contact pads 46, 44 and onto respective contact pads 50, 48 to establish the electric connections from the latter two contact pads and through contacts 84, 86 to illumination element 92.

Therefore, it can be appreciated that the matching polarizing features of the socket and the lamp assembly allow the lamp assembly base to be inserted into the socket through-hole only when the respective polarizing features are in unique circumferential registry. After having been so inserted, the lamp assembly can then be circumferentially indexed a fixed distance to installed position where the pair of contacts 84, 86 on its base are in respective contact with the respective contact pads 50, 48 on wiring board 32, thereby placing illumination element 92 of the lamp assembly in circuit across contact pads 48, 50, and hence across printed wires 56, 58.

Lamp assembly model 68 is installed in socket 42 in the same way. By disposing lamp assembly 68 relative to socket 42 in the manner suggested by FIG. 2 with the respective polarizing features in registration, and then advancing the lamp assembly toward the wiring board, the lamp assembly can be passed through the through-hole until flange 74 abuts the wiring board around the margin of the through-hole. It can then be twisted to installed position where locking tabs 76, 78 lock onto the margin of the socket with the clockwise radial margin 62C, 64C of each cut-out 62, 64 becoming lodged in the respective throat 82, 80. As the socket is being twisted, the domes of the respective contacts 102, 104 ride onto respective contact pads 46, 44 to establish the electric connections from the latter two contact pads and through contacts 102, 104 to illumination element 92. Thus in its installed position, lamp assembly 68 is connected to printed wires 52, 54, and not printed wires 56, 58.

Figure 2:
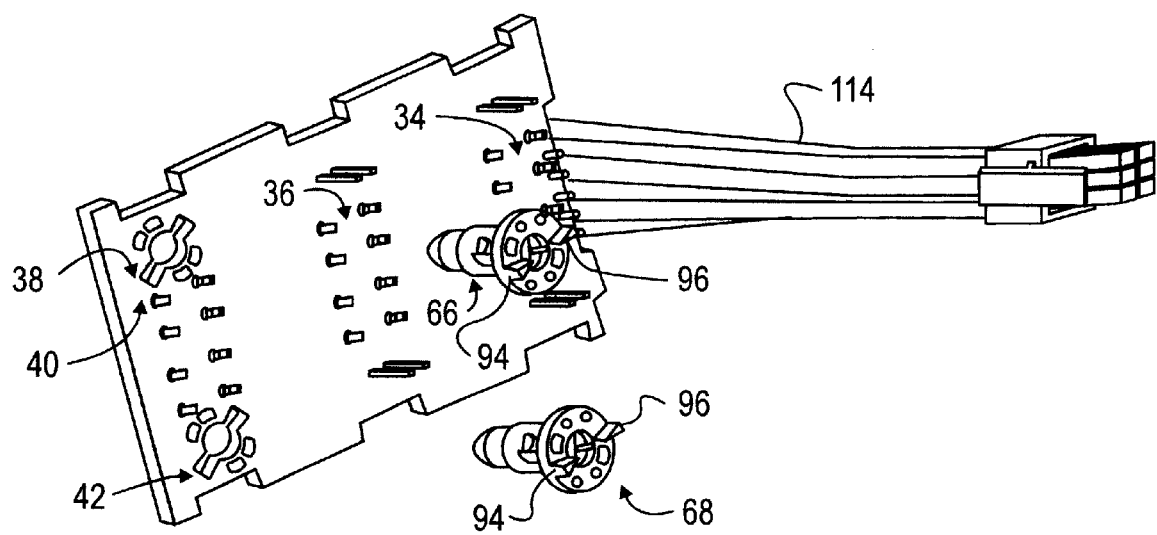
FIG. 2 is an enlarged perspective view in the direction of arrow 2 in FIG. 1.
Figure 3:
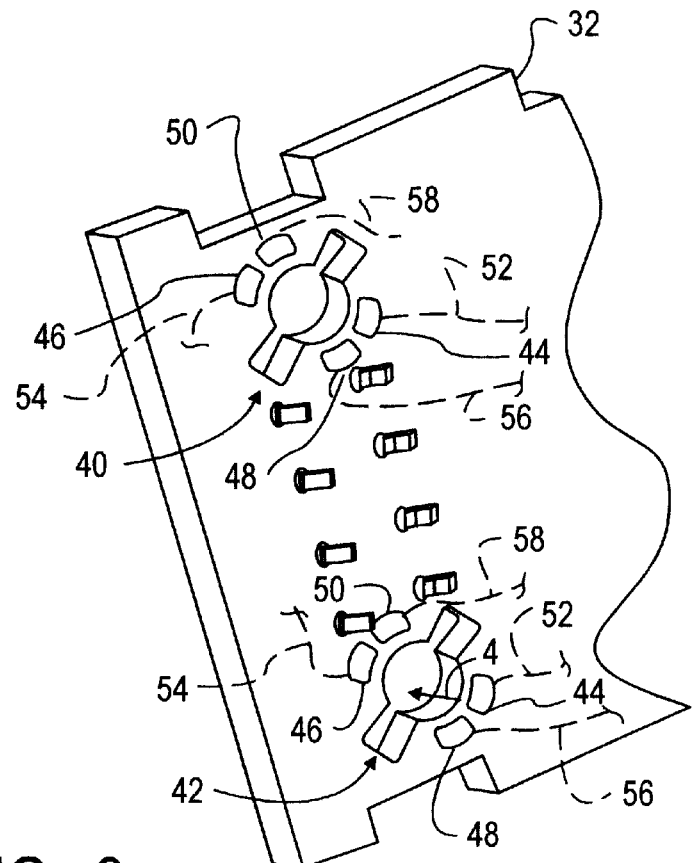
FIG. 3 is an enlarged view of the left hand portion of FIG. 2.

As shown by FIG. 2, printed wires 52, 54, 56, 58 lead to respective terminals along a side of wiring board 32, and they in turn are connected to a wiring harness of the vehicle (not shown) via a pigtail 114. One of the lamp assemblies 66, 68 may be a status indicator lamp and the other a nighttime illumination lamp. As such, the nighttime illumination lamp may be connected with a dimmer circuit of the vehicle for setting a desired intensity of nighttime illumination. The status indicator lamp will illuminate whenever switch assembly 18 is on, and depending upon specific electric circuit design, the status indicator lamp may be fed from wiring board by connecting one of the two printed wires that feeds it to the printed wire on the board that comes from the switched side of switch assembly 18.

Because either lamp assembly model 66, 68 can be installed in either socket 40, 42, a common wiring board 32 can be used in different modules. If contacts 44, 46 of both sockets 40, 42 are connected to the dimmer circuit of the vehicle, and if lamp assembly model 68 is a nighttime illumination lamp, upper socket 40 becomes a nighttime illumination socket simply by installing a lamp assembly model 68 in that socket. In that case, lower socket 42 can be a switch status indicator socket in which a lamp assembly model 66 is installed to function as a status indicator lamp for switch assembly 18. If it is instead desired that the roles of the upper and lower sockets be reversed, then a lamp assembly model 68 is installed in socket 42, and a lamp assembly model 66 is installed in socket 40.

It can be appreciated that further variations are possible, for example by not connecting corresponding contact pads of the two sockets in common. Moreover, different numbers of sockets may be present in any given model of wiring board, and locations may vary. In other words, status and illumination lamps may be associated with more than one switch assembly. Furthermore, other forms of polarizing features may be employed for different reasons.

It is also possible that where two adjacent contact pads are always at the same electric potential, such as ground, they may be integrated as a single, longer pad. In that case the single longer pad and a first one of the other two contact pads would form a first contact pair, and the single longer contact pad and the second one of the other two contact pads would form a second contact pair. For example, if contact pads 44 and 48 were both connected to ground, they could be formed as a single longer pad so that the socket would appear to have three discrete contact pads rather than the four shown in the drawings.

While a presently preferred embodiment of the invention has been illustrated and described, it should be appreciated that principles of the invention are applicable to all embodiments that fall within the scope of the following claims.

What is claimed is:

1. A dual function lamp socket comprising:
    a substantially rigid wiring board containing a through-hole that has a perimeter margin bounding an opening;
    plural discrete contact pads disposed on the board surface spaced apart around the margin of the through-hole;
    plural discrete conductor traces that run on the board surface from the plural discrete contact pads;
    the perimeter margin of the through-hole having a polarizing feature that allows a base of a first lamp assembly model that has a matching polarizing feature to be inserted into the through-hole only when the respective polarizing features are in unique circumferential registry and after having been so inserted, the first lamp assembly model to be circumferentially indexed a fixed distance to an installed position where a pair of contacts on the base of the first lamp assembly model are in contact with a first pair of the contact pads to place a lamp of the first lamp assembly model in circuit across the first pair of contact pads;
    the plural discrete contact pads comprising a second pair that is distinct from the first pair and disposed not to place the lamp of the first lamp assembly model in circuit across the second pair of contact pads when the base of the first lamp assembly model is in the installed position, but instead to place the lamp of a second lamp assembly model in circuit across the second pair of contact pads when a base of the second lamp assembly model that has the same polarizing feature as that of the first lamp assembly model has been inserted into the through-hole and the second lamp assembly model indexed the fixed distance to the installed position and not to place the lamp of the second lamp assembly model in circuit across the first pair of contact pads when the second lamp assembly model is in the installed position.

2. A dual function lamp socket as set forth in claim 1 in which there are four discrete contact pads, the first pair comprises a first and second contact pad, and the second pair comprises a third and fourth contact pad.

3. A dual function lamp socket as set forth in claim 2 in which a first of the conductor traces runs from the first contact pad, a second of the conductor traces runs from the second contact pad, a third of the conductor traces runs from the third contact pad, and a fourth of the conductor traces runs from the fourth contact pad.

4. A dual function lamp socket as set forth in claim 3 further including multiple terminals on the board adapted for connection with a wiring harness, and in which each of the four conductor traces has continuity with a respective terminal.

5. A circuit board assembly for use with an electrical panel of an automotive vehicle comprising:
    a substantially rigid wiring board containing a plurality of through-holes each of which has a perimeter margin bounding an opening;
    plural discrete contact pads disposed on the board surface spaced apart around the margin of each through-hole;
    plural discrete conductor traces that run on the board surface from the plural discrete contact pads;

the perimeter margin of each through-hole having a polarizing feature that allows a base of a first lamp assembly model that has a matching polarizing feature to be inserted into the through-hole only when the respective polarizing features are in unique circumferential registry and after having been so inserted, the first lamp assembly model to be circumferentially indexed a fixed distance to an installed position where a pair of contacts on the base of the first lamp assembly model are in contact with a first pair of the contact pads to place a lamp of the first lamp assembly model in circuit across the first pair of contact pads;

the plural discrete contact pads around the margin of each through-hole comprising a second pair that is distinct from the first pair and disposed not to place the lamp of the first lamp assembly model in circuit across the second pair of contact pads when the base of the first lamp assembly model is in the installed position, but instead to place the lamp of a second lamp assembly model in circuit across the second pair of contact pads when a base of the second lamp assembly model that has the same polarizing feature as that of the first lamp assembly model has been inserted into the through-hole and the second lamp assembly model indexed the fixed distance to the installed position and not to place the lamp of the second lamp assembly model in circuit across the first pair of contact pads when the second lamp assembly model is in the installed position;

a first lamp assembly model disposed in installed position in a first of the through-holes; and a second lamp assembly model disposed in installed position in a second of the through-holes.

6. A circuit board assembly as set forth in claim 5 in which the margin of each of the first and second through-holes has respective first, second, third, and fourth discrete contact pads arranged in a defined geometric relationship to each other, the first pair of contact pads for the first through-hole comprises its first and second contact pads, the second pair of contact pads for the first through-hole comprises its third and fourth contact pads, the first pair of contact pads for the second through-hole comprises its first and second contact pads, and the second pair of contact pads for the second through-hole comprises its third and fourth contact pads.

7. A circuit board assembly as set forth in claim 6 in which a first of the conductor traces is common to the first contact pads of both the first and the second through-holes, and a second of the conductor traces is common to the second contact pads of both the first and second through-holes.

8. A circuit board assembly as set forth in claim 7 further including a multiple terminals on the board adapted for connection with a wiring harness, and in which each of the first and second conductor traces has continuity with a respective terminal.

9. An electric module comprising:

a housing;

a back-lighted member on a face of the housing;

a substantially rigid wiring board disposed behind the face of the housing and containing a through-hole that registers with the back-lighted member and that has a perimeter margin bounding an opening;

plural discrete contact pads disposed on the board surface spaced apart around the margin of the through-hole;

plural discrete conductor traces that run on the board surface from the plural discrete contact pads;

the perimeter margin of the through-hole having a polarizing feature that allows a base of a first lamp assembly model that has a matching polarizing feature to be inserted into the through-hole only when the respective polarizing features are in unique circumferential registry and after having been so inserted, the first lamp assembly model to be circumferentially indexed a fixed distance to an installed position where a pair of contacts on the base of the first lamp assembly model are in contact with a first pair of the contact pads to place a lamp of the first lamp assembly model in circuit across the first pair of contact pads;

the plural discrete contact pads comprising a second pair that is distinct from the first pair and disposed not to place the lamp of the first lamp assembly model in circuit across the second pair of contact pads when the base of the first lamp assembly model is in the installed position, but instead to place the lamp of a second lamp assembly model in circuit across the second pair of contact pads when a base of the second lamp assembly model that has the same polarizing feature as that of the first lamp assembly model has been inserted into the through-hole and the second lamp assembly model indexed the fixed distance to the installed position and not to place the lamp of the second lamp assembly model in circuit across the first pair of contact pads when the second lamp assembly model is in the installed position.

10. An automotive vehicle comprising:

an interior electrical panel that contains switches and indicator lamps for a driver of the vehicle and that has a front face containing plural back-lighted members for presenting information to the driver, including information regarding status of the switches;

a wiring board assembly disposed behind the front face comprising a substantially rigid wiring board containing a plurality of through-holes each of which has a perimeter margin bounding an opening and each of which registers with a respective back-lighted member;

plural discrete contact pads disposed on the board surface spaced apart around the margin of each through-hole;

plural discrete conductor traces that run on the board surface from the plural discrete contact pads;

the perimeter margin of each through-hole having a polarizing feature that allows a base of a first lamp assembly model that has a matching polarizing feature to be inserted into the through-hole only when the respective polarizing features are in unique circumferential registry and after having been so inserted, the first lamp assembly model to be circumferentially indexed a fixed distance to an installed position where a pair of contacts on the base of the first lamp assembly model are in contact with a first pair of the contact pads to place a lamp of the first lamp assembly model in circuit across the first pair of contact pads;

the plural discrete contact pads around the margin of each through-hole comprising a second pair that is distinct from the first pair and disposed not to place the lamp of the first lamp assembly model in circuit across the second pair of contact pads when the base of the first lamp assembly model is in the installed position, but instead to place the lamp of a second lamp assembly model in circuit across the second pair of contact pads when a base of the second lamp assembly model that has the same polarizing feature as that of the first lamp assembly model has been inserted into the through-hole and the second lamp assembly model indexed the fixed distance to the installed position and not to place the lamp of the second lamp assembly model in circuit across the first pair of contact pads when the second lamp assembly model is in the installed position;

first lamp assembly models disposed in installed position in through-holes that register with back-lighted members that provide switch status information; and second lamp assembly models disposed in installed position in through-holes that register with back-lighted members other than back-lighted members that provide information other than switch status information.

* * * * *